United States Patent
Sasaki

(10) Patent No.: US 6,822,247 B2
(45) Date of Patent: Nov. 23, 2004

(54) ION IRRADIATION SYSTEM

(75) Inventor: Yuichiro Sasaki, Kanagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/334,544

(22) Filed: Dec. 30, 2002

(65) Prior Publication Data

US 2003/0230732 A1 Dec. 18, 2003

(30) Foreign Application Priority Data

Dec. 28, 2001 (JP) ........................ 2001-400164

(51) Int. Cl.[7] ................ H01J 37/317; H01J 37/304
(52) U.S. Cl. ............... 250/492.21; 250/306; 250/307; 250/309; 250/492.1; 250/492.2
(58) Field of Search ................ 250/306–309, 250/492.1, 492.2, 492.21, 251, 442.11, 492.3, 396 R, 397–398, 492.22, 492.23

(56) References Cited

U.S. PATENT DOCUMENTS

| | | | |
|---|---|---|---|
| 3,778,626 A | * 12/1973 | Robertson | 250/492.1 |
| 4,529,031 A | * 7/1985 | Scheinecker et al. | 164/478 |
| 4,529,931 A | 7/1985 | Kuhns | |
| 4,687,987 A | * 8/1987 | Kuchnir et al. | 324/71.3 |
| 4,956,306 A | * 9/1990 | Fuller et al. | 438/527 |
| 5,089,710 A | * 2/1992 | Kikuchi et al. | 250/492.3 |
| 5,343,047 A | * 8/1994 | Ono et al. | 250/492.21 |
| 5,440,210 A | * 8/1995 | Bogaty et al. | 315/383 |
| 5,998,798 A | * 12/1999 | Halling et al. | 250/492.21 |
| 6,100,536 A | * 8/2000 | Ito et al. | 250/492.21 |
| 6,320,369 B1 | * 11/2001 | Hidaka et al. | 324/117 R |
| 2003/0193090 A1 | * 10/2003 | Otani et al. | 257/758 |

FOREIGN PATENT DOCUMENTS

| | | |
|---|---|---|
| EP | 0 964 426 | 12/1999 |
| JP | 62-145738 A | 6/1987 |
| JP | 63-284500 | 11/1988 |
| JP | 01-024353 A | 1/1989 |
| JP | 01-116482 A | 5/1989 |
| JP | 04-132151 A | 5/1992 |
| JP | 06-084491 A | 3/1994 |
| JP | 07-135099 A | 5/1995 |
| SU | 739422 A | 6/1980 |

OTHER PUBLICATIONS

European Search Report for EP 02 02 9072, dated Mar. 19, 2003.
European Search Report for EP 02 02 9072, dated Jun. 18, 2003.
L. Hao et al., "Ion Beam Measurement with a High–Temperature Superconductor Squid and Current Comparator," IEEE Transactions on Instrumentation and Measurement, vol. 50, NO. 2, pp. 302–305, Apr., 2001.
T. Tanabe et al., "A cryogenic current–measuring device with nano–ampere resolution at the storage ring TARN II," Nuclear Instruments and Methods in Physics Research—A, vol. 427, No. 3, pp. 455–464 (May 21, 1999).

* cited by examiner

Primary Examiner—John R. Lee
Assistant Examiner—Bernard E. Souw
(74) Attorney, Agent, or Firm—RatnerPrestia

(57) ABSTRACT

An ion irradiation system has a leader and a trailer at its beam line, and at least one non-beam-breaking beam-current measuring instrument is prepared between the leader and the trailer. The leader is an ion source, and the trailer is a process chamber where semiconductor wafers are placed. The beam-current measuring instrument is placed before the wafers.

34 Claims, 4 Drawing Sheets

ION IRRADIATION SYSTEM

FIELD OF THE INVENTION

The present invention relates to an ion irradiation system, of which beam line includes a leader and a trailer. A value of the beam current between the leader and the trailer is measured by a beam non-breaking method.

BACKGROUND OF THE INVENTION

Ion irradiation systems, having a leader and a trailer at their beam lines, include an ion implantation system or an electron-beam exposure system that implants ions into a target or irradiates a target with ions. Those systems are widely used in semiconductor manufacturing. The ion implantation system is used in an ion implanting process, where impurity is doped into a semiconductor wafer. In this process, an amount of ions to be implanted needs to be accurately controlled. In general, a beam current of the ion beam is measured with a Faraday cup disposed behind or on both sides of the wafer, then the implanted ion amount is controlled by a dose-controller. Precise control of the ion amount to be implanted needs a correct measurement of an amount of beam current.

A measurement of beam current in the middle of a beam line requires a Faraday cup prepared in the middle of the beam line. This Faraday cup is disposed at a place where the cup does not touch the ion beam while the water is irradiated with ions, and moved to a measuring place where the cup traps the ion beam as needed. However, the cup cuts off the ion beam during the measurement, so that the wafer is not irradiated with the beam.

Such an ion implantation system cannot irradiate the wafer with ion beam simultaneously in measuring a beam current value. Various methods have been disclosed to overcome this problem. For instance, plural substrates are placed on a rotary disc prepared in a process chamber of a high-current ion implantation system. The disc is rotated while it is in pendulum movement, so that the surfaces of the substrates are scanned and irradiated with the ion beam. As a result, the ion is implanted into the substrates.

There is a technique that perforation, e.g., is provided to the disc, and ion beam running through the perforation is received with the Faraday cup for measuring. Another technique available in a medium-current ion implantation system is that Faraday cups are prepared on both sides of a substrate, and a scan of the substrate surface with ion beam is over-scanned beyond the Faraday cups, so that a current value of the ion beam is measured. Those techniques allow the high-current ion implantation system to measure the current value of ion beam at intervals of approx. 200 msec and the medium-current ion implantation system to measure the current value at a shorter intervals than that of the high-current system.

A conventional ion implantation system, which measures a beam current with a Faraday cup, must be quipped with the Faraday cup disposed close to a semiconductor wafer or close to a beam track for measuring a beam current at the foregoing short intervals while the wafer is irradiated with an ion beam. In other words, the Faraday cup breaks the ion beam during the measuring because of its operating principles. Thus the ion-beam track must be away at a given distance from the wafer during the measuring. On the other hand, the ion-beam track or the wafer must be moved while the wafer is irradiated with the ion-beam so that the ion-beam can arrive at the wafer. It is necessary to increase the moving speed and/or shorten the moving distance in order to shorten a time difference between a moment of measurement and a moment of irradiation. The foregoing high-current ion implantation system is an example of moving the wafer.

An example of moving the ion-beam track is available in the medium-current ion implantation system discussed previously. A substantial change of an ion-beam track is not practical because it requires large electrical field or magnetic field and needs a large space. In any case, the moving distance must be shortened, so that the Faraday cup needs to be placed close to the semiconductor wafer. In this case, the ion beam having passed nearby the wafer is to be measured.

However, the ion beam having passed nearby the wafer loses parts of its electric charges due to outgas, which is generated during the implantation from the resist applied to the wafer. A major component of the outgas is hydrogen gas. The ion collides with the outgas, so that the ion is neutralized into an atom. This collision reduces little kinetic energy, and the atom is doped as impurity into the substrate. A ratio of the ions neutralized depends partially on a pressure of the outgas; however, assume that 100 pieces of ions are accelerated. Then approx. 90 pieces out of 100 arrive at the substrate as they are as ions, and approx. 10 pieces collide with the outgas and lose their electric charges, thereby being neutralized. An amount of the impurities in the wafer is actually 100 pieces; however, the Faraday cup measures that approx. 90 pieces of impurities are doped. This problem is unavoidable because the ion-beam having passed nearby the wafer is measured.

A correcting method to overcome this problem is disclosed. This method utilizes the fact that the ratio of an out gas pressure vs. ions to be neutralized stays almost constant. A relational expression about the ratio of a pressure inside the chamber vs. the ions to be neutralized is determined in advance by experiment. Then during the implantation, a pressure in the chamber is measured, thereby correcting the values measured by the Faraday cup. In fact this method incurs an error of several % even after the correction because pressure distribution in the chamber varies with time and relational expressions determined by the experiences include errors. A malfunction of the pressure gage causes abnormality in the correction, and produces a failure. This phenomenon often happens just before a periodic maintenance of the pressure gage.

FIG. 6 shows an example of a conventional high-current ion implantation system. Perforation is provided to disc 8, and ion beam 5 passing through the perforation is received by Faraday cup 6, thereby measuring a beam current. This method allows measuring a value of the beam current at intervals of 200 msec. In fact ion beam 5 having passed through outgas 4 is measured, so that a less value of the ion beam than the value actually implanted into wafer 7 is output. Therefore, a pressure of process chamber 11 is measured in advance by a pressure gage (not shown), and the beam-current value measured is corrected based on the ratio of the ions neutralized by the pressure and outgas 4 vs. all the ions. However, this relational expression includes an error because a relation of the pressures at between the place where the pressure gage is disposed and the place where ion beam 5 passed is not always constant. Those factors inevitably produce an error of several % in a measured value of the beam current.

FIG. 7 shows another example of a conventional high-current ion implantation system. Rotary disc 8 is moved so that ion beam 5 does not hit wafer 7, and when disc 8 arrives at the place where disc 8 does not interrupt beam 5, the beam current is measured by Faraday cup 6. In this case, outgas 4 does not influence the measurement; however, the beam current can be measured only at intervals of movement of disc 8. In other words, the beam current can be measured at intervals of 20–30 seconds, and a change of the beam current during the interval cannot be measured.

SUMMARY OF THE INVENTION

An ion implantation system is provided. A beam line in this system has a leader and a trailer, and at least one non-beam-breaking beam-intensity measuring instrument is disposed between the leader and the trailer.

DETAILED DESCRIPTION OF THE PREFERRED EMBODIMENT OF THE INVENTION

An exemplary embodiment of the present invention is demonstrated hereinafter with reference to the accompanying drawings. First, a high-current ion implantation system in accordance with an exemplary embodiment of the present invention is demonstrated. The present invention is not limited to this exemplary embodiment. The present invention can be applied to a medium-current ion implantation system, an electron beam exposure system, or an accelerator (cyclotron, synchrotron, linear accelerator), thereby producing a similar advantage.

Figure 1:
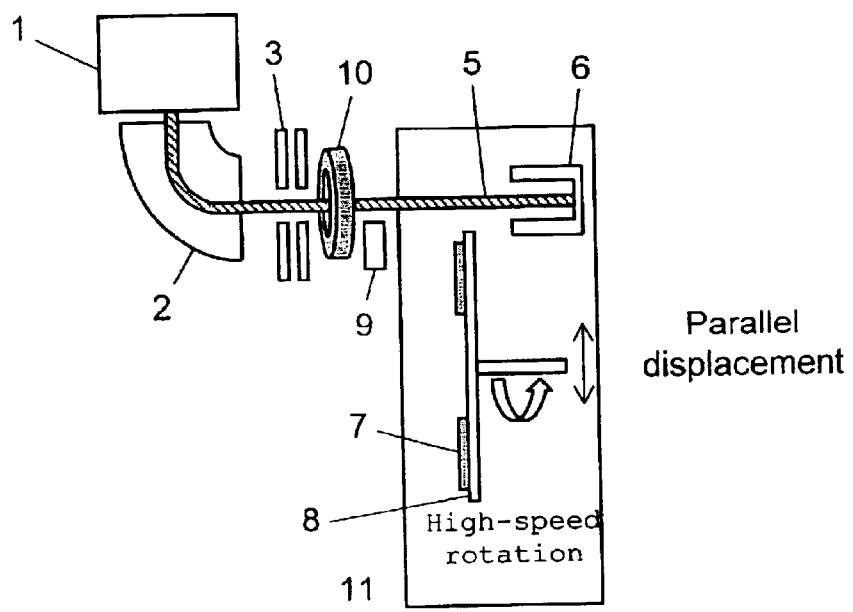
FIG. 1 is a schematic diagram illustrating a high-current ion implantation system in accordance with an exemplary embodiment of the present invention. In the drawing a semiconductor wafer is about to be replaced.

FIG. 1 is a schematic diagram illustrating a high-current ion implantation system in accordance with this exemplary embodiment of the present invention. In the drawing semiconductor wafer 7 is about to be replaced. A beam line starts from ion-source 1 as a leader and ends at process chamber 11, where wafer 7 is disposed, as a trailer. Next to ion-source 1, mass spectrograph 2 is disposed for passing selectively the ions that have a desirable mass-to-charge ratio. The ions selected are again selected by degradation slits (not shown). In this embodiment, mass spectrograph 2 and the degradation slits work as an ion-beam selector. The ions passing the slits are accelerated through accelerating tube 3, then undergo detection by a beam-current measuring instrument 10 and pass nearby rotary disc 8 on which wafers 7 are placed. Finally the ions arrive at Faraday cup 6. Then wafers 7 are replaced with new wafers 7 on disc 8, and a beam current is measured by Faraday cup 6 after a degree of vacuum of the beam line reaches a desirable level. The beam-current value measured is sent to computer 32 (not shown) and stored there.

Figure 2:
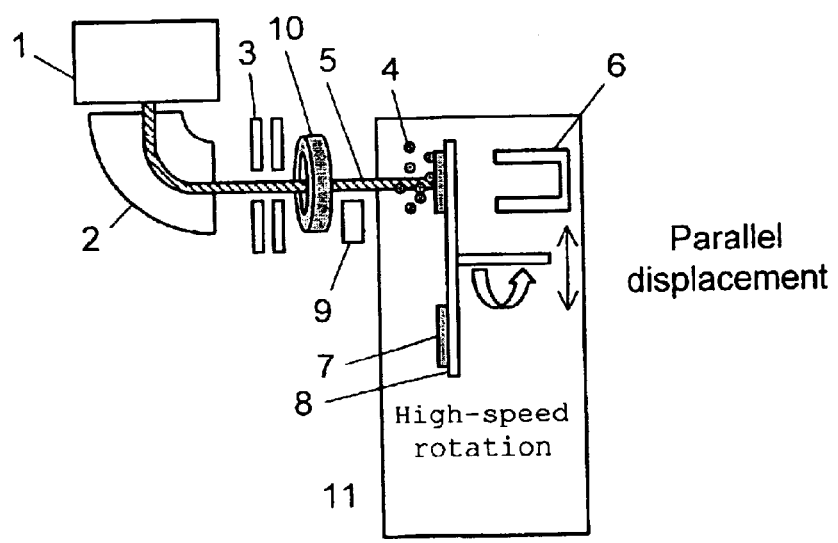
FIG. 2 is a schematic diagram illustrating the high-current ion implantation system in accordance with the exemplary embodiment of the present invention. In the drawing ions are being implanted.

FIG. 2 is a schematic diagram illustrating the high-current ion implantation system in accordance with the exemplary embodiment, where ions are being implanted. Rotary disc 8 shown in FIG. 1 moves to the place shown in FIG. 2, where wafer 7 is irradiated with ions. On disc 8, wafers 7 are placed in the quantity of 24 sheets, and disc 8 is spun at a high speed while it is in pendulum movement so that the surfaces of wafers 7 are scanned and irradiated with ion-beam for implanting ions. Irradiating wafer 7 with ions generates outgas 4 from the resist applied to wafers 7. Outgas 4 flows toward accelerating tube 3; however, a placement of vacuum pump 9 between beam-current measuring instrument 10 and wafers 7 prevents outgas 4 from reaching measuring instrument 10.

During the ion implantation, measuring instrument 10 measures a beam current from the initial value and the changes onward, and sends those data to computer 32 (not shown) at intervals of approx. 0.1 msec. The initial value and a value changed and stored in computer 32 are added together, so that a beam current value can be monitored at intervals of approx. 0.1 msec. Then based on those data, a dose controller can accurately control an implantation amount. After the implantation, disc 8 is moved to a place where the wafers are not irradiated with ions, i.e., the place shown in FIG. 1, then wafers 7 are replaced with new ones. The foregoing operation is repeated.

Rotary disc 8 can be provided with perforation for passing the beam. A non-beam-breaking beam-current measuring instrument is desirably placed after the ion-beam selector and before the semiconductor wafers placed in the process chamber of the ion implantation system that has the following structure: a leader is an ion source, and next to the ion source there are at least an ion-beam selector for selecting ion beams and an accelerator for accelerating the selected ion beams and irradiating the wafer with the selected ion beams, and a trailer is a process chamber where the wafers are prepared. Further, a vacuum pump is preferably placed on the beam line between the measuring instrument and the wafers. The ion-beam selector selects the ions that have desirable ionic species and charges, and is formed of, in general, a mass spectrograph and slits prepared after the spectrograph.

The reason why the non-beam-breaking beam-current measuring instrument is placed after the ion-beam selector is described hereinafter. If the measuring instrument is placed before the ion-beam selector, the ions include undesirable ions which are to be removed by the selector, so that a beam-current intensity decreases when the ion-beam passes through the selector. An object of the system is to regulate an amount of impurity to be implanted into the wafer per unit time, and which amount is well proportionate to an intensity of the beam-current undergone the ion-beam selector. Therefore, the non-beam-breaking beam-current measuring instrument is preferably placed after the ion-beam selector.

Next, the reason why the measuring instrument is placed before the wafer is described hereinafter. Outgas is generated from the photo-resist applied to the wafer when ions are implanted. Since the wafer is placed in the process chamber, a placement of the measuring instrument before the wafer allows the instrument to measure a beam-current intensity before the beam-current touches the outgas.

The reason why the vacuum pump is desirably prepared at the foregoing place is this: the outgas flowing toward upstream along the beam line can be removed before the place where the non-beam-breaking beam-current measuring instrument is placed, i.e., downstream from the measuring instrument. This structure allows measuring the beam-current with less influence of the outgas. Further a pressure gage is preferably placed between the measuring instrument and the wafer because the gage can correct influence of the ougas still remained.

In the case that a substance interacting with ions exists between the leader and the trailer of the beam line, and one of the interactions is an exchange of electric charges, then it is preferable to use the structure of the present invention. Because influence of the substance interacting during the beam-current measurement to the beam can be neglected. An example of the substance interacting is the outgas generated during the ion-beam irradiation from the photo-resist applied to the wafer. Hydrogen gas is an example of the outgas.

Figure 3:
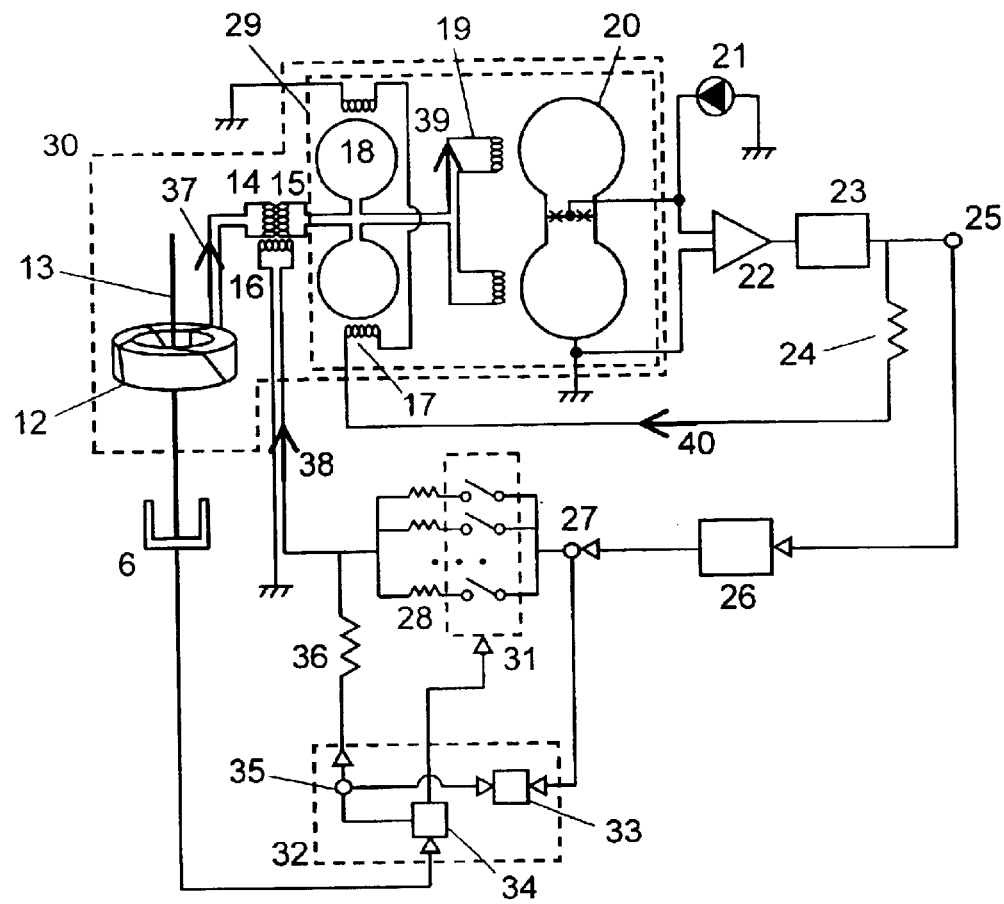
FIG. 3 shows a circuit diagram of an instrument for measuring a beam current intensity. The instrument is employed in the high-current ion implantation system in accordance with the exemplary embodiment of the present invention.

Next, an example of the non-beam-breaking beam-current measuring instrument is described hereinafter. FIG. 3 shows a circuit diagram of the measuring instrument 10 employed in the high-current ion implantation system. Beam-current 13 in FIG. 3 corresponds to ion-beam 5 in FIG. 1.

Beam-current measuring instrument 10 comprises the following elements:

(a) a detector for detecting magnetic field corresponding to a beam current;

(b) a magnetic flux transmitter for transmitting a magnetic flux to a measuring section;

(c) a measuring section including a superconducting element sensitive to the magnetic flux transmitted, and a feedback coil that passes feedback current such that a change of the magnetic flux extending through the superconducting element is cancelled;

(d) a magnetic shielding section including a superconductor having a gap and shielding the detector, the magnetic flux transmitter and the measuring section against magnetism from outer space including the space where ion-beam flows; and (e) at least one control circuit for regulating an amount of magnetic flux transmitted to the measuring section, where the control circuit allows the magnetic flux induced by the ion-beam current to be canceled, before being transmitted to the measuring section, by one of the detector or the magnetic flux transmitter, or by both of those elements.

The detector uses detecting coil 12 formed by winding superconducting wire four turns on a soft magnetic core. The core has an inner diameter of 250 mm, an outer diameter of 320 mm and a height of 30 mm. The soft magnetic core is made from amorphous material that has small coercive force and large magnetic permeability.

The magnetic flux transmitter includes transformer input-coil 14, coil 15 coupled to the measuring section, a transformer formed by winding coil 16 on a soft magnetic core where coil 16 cancels changes of the magnetic flux, and a superconducting wire coupling the detector to the measuring section.

Trans input-coil 14 is coupled to detecting coil 12. Coil 16 cancels the magnetic flux induced in the soft magnetic core of the transformer by the current running through coil 14. This core is made from the same material as the core of detecting coil 12, and has an inner diameter of 10 mm, an outer diameter of 12.5 mm and a height of 5 mm. Coil 14 is wound 100 turns, coil 15 coupled to the measuring section is wound 15 turns, and coil 16 for canceling changes of the magnetic flux is wound 10 turns.

The measuring section adopts a superconducting circuit that uses a DC superconducting quantum interference device (SQUID). The super conducting circuit includes DC SQUID 20, SQUID input coil 19, feedback coil 17 and washer coil 18, all of which are assembled on SQUID chip 29.

The superconducting magnetic shielding section surrounds the detector, magnetic flux transmitter and measuring section. Area 30 is surrounded by the magnetic shielding section; however area 30 is not completely surrounded but a surrounding section of the detector has a gap of 0.5 mm wide. The superconducting magnetic shielding section is made from lead. The detector, magnetic flux transmitter, measuring section and shielding section are put in a cryostat and cooled down to the temperature of liquid helium.

Assume that an initial status of the ion implantation system is this: beam-current IB13 having a given intensity extends through detecting coil 12. An initial value of beam-current IB13 is measured by Faraday cup 6 and sent to computer 32. Voltage VC35 responsive to the initial value is supplied from signal output section 34, thereby feeding resistor RC 36 with a current. Voltage VC35 is then supplied to beam-current value display section 33.

Further, signal output section 34 outputs a signal, which sets a value of variable resistor RB28, to controller 31 formed of variable resistors RB28. Variable resistors RB28 thus change their own value responsive to the initial value of beam-current IB13. Applying voltage VC35 across resistor RC36 causes feedback current IF28 to flow. Feedback current IF28 at this moment is determined by a ratio of voltage VC35 vs. resistor RC36, namely, IF=VC/RC. On the other hand, beam-current IB13 induces detection current IP37 in a superconducting closed circuit formed of detecting coil 12 and transformer input-coil 14.

Detection current IP37 and feedback current IF38 run respectively through transformer input-coil 14 and coil 16 that cancels changes of the magnetic flux, thereby inducing magnetic flux in the soft magnetic core of the transformer. Since feedback current IF38 is variable by voltage VC35, current IF 38 can be set such that the magnetic flux inside the soft magnetic core of the transformer can take a value of 0 (zero).

Values of voltage VC35 corresponding to various initial values of beam-current IB13 are determined in advance by experiment, so that computer 32 can automatically sets a value of voltage VC35. As such, in the initial state, detection current IP37 and feedback current IF 38 induce respectively magnetic fluxes in the soft magnetic core of the transformer, and the sum of the respective magnetic fluxes become zero (0), namely, they balance with each other. In this case, current is not induced in coil 15 coupled to the measuring section, so that SQUID input current IT 39 does not run through SQUID chip 29.

An intensity change of beam current IB13 from the initial state proportionally changes detection current IP37. This relation is expressed in $\Delta IP = \alpha \times \Delta IB$, where $\Delta IP$ is a change amount of detection current IP37 and $\Delta IB$ is a change amount of beam current IB13. This $\Delta IP$ allows the sum of the magnetic fluxes induced in the soft magnetic core to turn to a finite quantity proportionate to $\Delta IP$ from the balanced state of zero (0). Then SQUID input current IT39 is induced in the super-conducting closed circuit formed of coil 15, washer coil 18 and SQUID input coil 19. Input current IT39 runs through coil 19 and tries to change an amount of the magnetic flux extending through SQUID 20; however, feedback current IF40 runs through coil 17 to prevent the amount of the magnetic flux from changing. Feedback current IF40 generates a voltage across feedback resistor RA24. This voltage is referred to as output voltage VA25, which is supplied to circuit 26.

Figure 4:
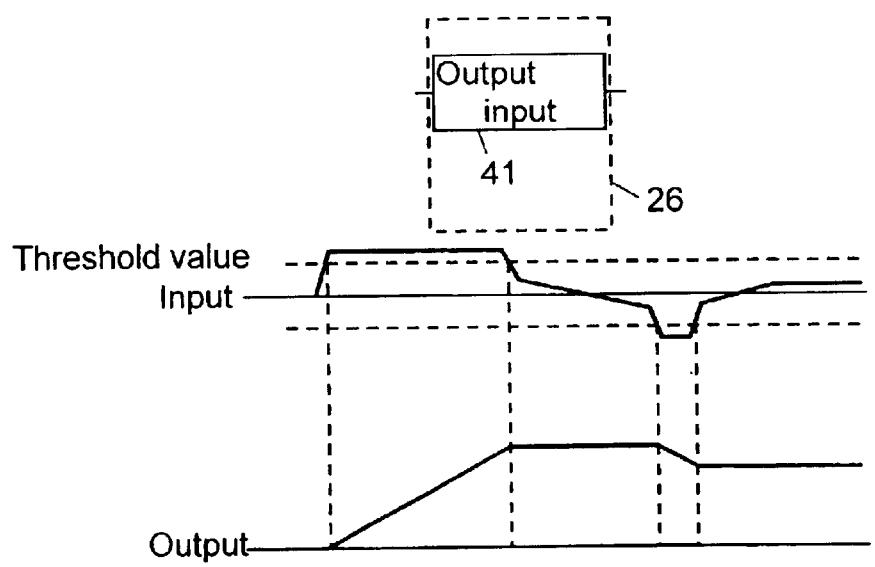
FIG. 4 shows an example of electronics circuit 26 in accordance with the exemplary embodiment of the present invention.

An embodiment where circuit 26 is formed of integrator 41, as shown in FIG. 4, is demonstrated hereinafter. Integrator 41 boosts output voltage 27 with a given time constant when output voltage 25, which is an input signal, exceeds a threshold value. When output voltage VA25 stays within the threshold value, output voltage VA 27 is supplied as it is at a given level. When output voltage VA25 falls below the threshold value, integrator 41 lowers output voltage VB27 with a given time constant. Generation of output voltage VB27 feeds variable resistor RB28 with current VB/RB, which is added to feedback current IF38. As similar to the above description, ΔIF=VB/RB, and this ΔIF allows the magnetic flux induced in coil 16, which is to cancel changes of magnetic flux, to cancel the magnetic flux induced by ΔIP at transformer input-coil 14.

Assume that the number of turns of input coil 14 is N14, and that of coil 16 is N16. Then ΔIF=(N14/N16)×ΔIP, and since ΔIP is proportionate to ΔIB, ΔIF=(N14/N16)×α×ΔIB. Output voltage VB27 is defined as VB=(N14/N16)×α×RB×ΔIB.

Thus the measurement of output voltage VB27 determines an output proportionate to ΔIB (change of beam current IB13). A measurement accuracy can be determined by setting a threshold value. For instance, a threshold value of output voltage VA25 is determined ±500 mV, which corresponds to ±100 nA of beam current IB13, thus beam current IB13 can be measured at the accuracy of ±100 nA. In this case, the measuring range is basically not limited, and setting of (N14/N16)×α×RB determines a level of output voltage VB27. For instance, assume that (N14/N16)×α is approx. 1/100, and variable resistor RB28 is 150 kΩ, then output voltage VB27 obtains 15V with respect to a change of 10 mA of ΔIB. In other words, beam current IB13 of 10 mA can be measured at an accuracy of approx. ±100 nA. Further, assume that a threshold value of output voltage VA25 is set at 150 mV, which corresponds to approx. ±10 nA of beam current IB13, and assume that (N14/N16)×α is approx. 1/100, and variable resistor RB28 is 1.5 MΩ, then output voltage VB27 obtains 15V with respect to a change of 1 mA of ΔIB. In other words, beam current IB13 of 1 mA can be measured at an accuracy of approx. ±10 nA.

As discussed above, changes of set values such as the threshold value of output voltage VA25 and variable resistor RB28 can adjust appropriately a measuring accuracy as well as output voltage VB27, so that a measuring range of beam current IB13 is basically not limited.

An intensity of beam current IB13 is found by adding ΔIF28 (a change of IB13) to the initial state of beam current IB13. In actual, the following calculations are performed on beam-current display section 33: IF=VC/RC, ΔIF=VB/RB, and the sum of those calculations, i.e. the sum=IF+ΔIF. Then beam current IB13 is calculated using the relation, determined in advance by experiment, between feedback current IF38 and beam current IB13.

The non-beam-breaking beam-current measuring instrument has at least one sensor sensitive to magnetic flux and at least one dc current transformer. Those elements measure indirectly the magnetic field formed by the beam, so that they are desirable because they practically do not influence the beam. The sensor has at least a superconducting ring structure where two Josephson junctions are disposed in parallel. This structure allows utilizing the quantization of magnetic flux, so that the sensor can be extremely sensitive to the magnetic flux. The beam-current measuring instrument having at least the sensor sensitive to magnetic flux desirably includes a detector which detects or collects the magnetic field corresponding to the beam current. This structure allows dividing job-category into two, one is to detect or collect the magnetic flux, and the other is a job of sensor, so that the instrument can be designed with ease. The beam-current measuring instrument including at least the sensor sensitive to magnetic flux preferably has a magnetic shielding section that shields the sensor against magnetism from outer space including a space where the ion-beam runs. Further, the magnetic shielding section is preferably formed of superconductor or high-temperature superconductor because those materials can substantially reduce outer magnetic field which turns to noises.

Figure 5:
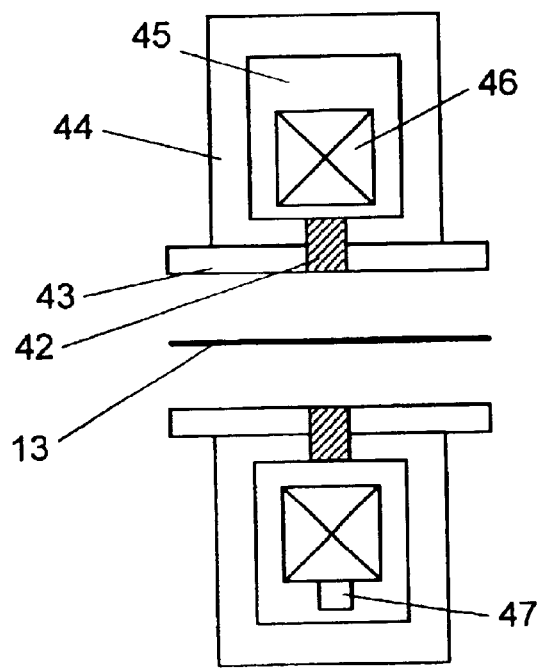
FIG. 5 shows a sectional view of an essential part of an installation example of the beam-current measuring instrument in accordance with the exemplary embodiment of the present invention.
Figure 6:
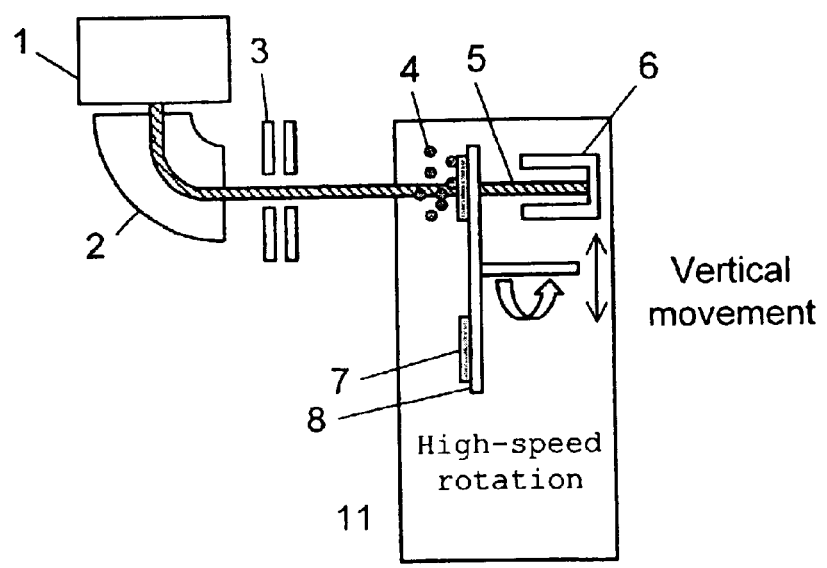
FIG. 6 shows an example of a conventional high-current ion implantation system.
Figure 7:
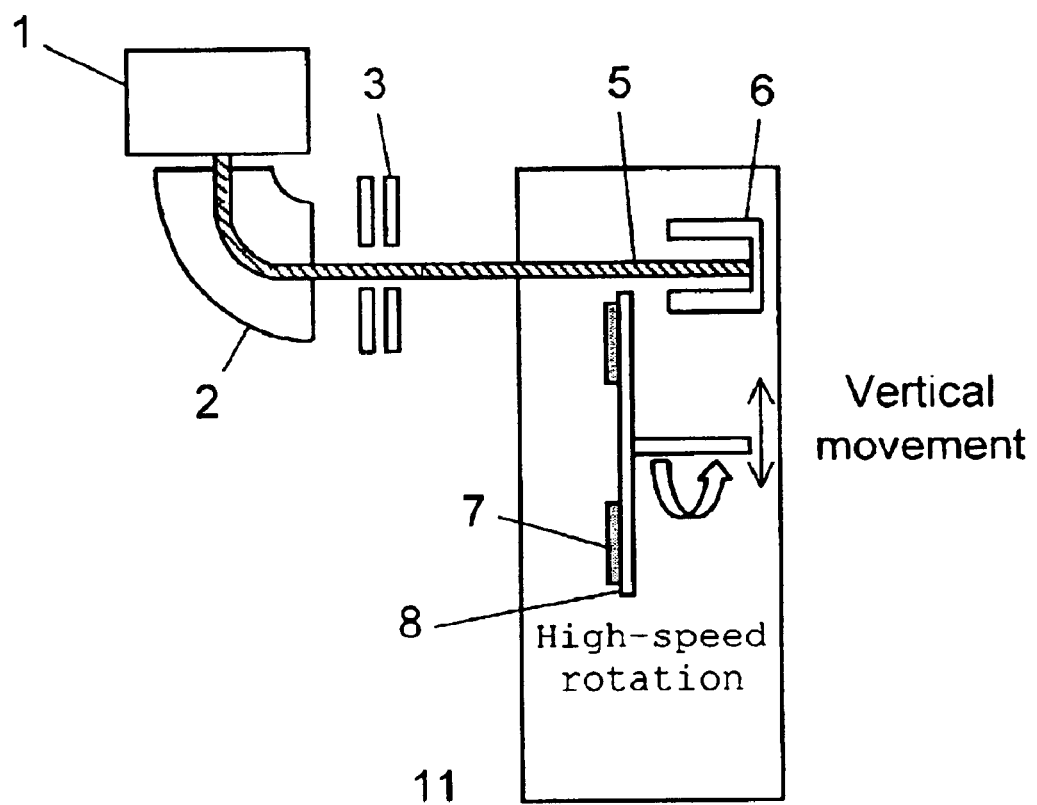
FIG. 7 shows another example of the conventional high-current ion implantation system.

Next, an installation of the beam-current measuring instrument is demonstrated hereinafter. FIG. 5 shows a sectional view of an essential part of an installation example of measuring instrument 10 (not shown) in the high-current ion implantation system of the present invention. First, provide the beam line with an installation space which is cylindrical and has a length of 40 cm. Then install measuring instrument 10 such that instrument 10 surrounds beam pipe 43 of the installation space.

Ceramic pipe 42 is disposed to beam pipe 43 such that a part of pipe 43 is cut vertically with respect to the longitudinal direction of pipe 43 and the cut face works as an insulator to the ceramic pipe 42. Bonding metal of ceramic is made from cupronickel that is non-magnetic material. This structure cuts off the current induced by beam current 13 and running on the wall of beam pipe 43. As a result, the magnetic field formed by beam current 13 can be collected by detection coil 12, and vacuum state of the beam line is not affected.

The present invention provides an ion irradiation system that allows controlling an irradiation amount by measuring a beam current accurately while a target is irradiated with ions. The ion irradiation system thus regulates an irradiation amount with less errors than a conventional system. A use of the ion irradiation system of the present invention allows manufacturing active components such as semiconductors, liquid crystal and bio-chips as well as passive components such as resistors, coils and capacitors.

What is claimed is:

1. An ion irradiation system comprising:
a beam line including a leader and a trailer; and
a non-beam-breaking beam-current measuring instrument disposed between the leader and the trailer, and the non-beam-breaking beam-current measuring instrument includes at least one sensor sensitive to magnetic flux.

2. The ion irradiation system of claim 1, wherein the leader is an ion source and the trailer is a process chamber where a semiconductor wafer is disposed, and the beam-current measuring instrument is disposed before the wafer.

3. The ion irradiation system of claim 2 further comprising an ion-beam selector, disposed after the ion source, for selecting ions,
wherein the beam-current measuring instrument is disposed after the selector.

4. The ion irradiation system of claim 2 further comprising a vacuum pump disposed on the beam line between the measuring instrument and the wafer.

5. The ion irradiation system of claim 2 further comprising a pressure gage disposed on the beam line between the measuring instrument and the wafer.

6. The ion irradiation system of claim 2, wherein a plurality of the wafers are disposed in the process chamber and placed on a rotary disc.

7. The ion irradiation system of claim 6, wherein the rotary disc has a rotary disc portion having perforation through which beams run.

8. The ion irradiation system of claim 6, wherein the rotary disc has a mechanism for moving the disc to a place where the wafers on the disc are not irradiated with the beam during a measurement of a beam current.

9. The ion irradiation system of claim 1, wherein a substance interacting with ion exists between the leader and the trailer of the beam line.

10. The ion irradiation system of claim 9, wherein the interaction is an exchange of electric charges.

11. The ion irradiation system of claim 9, wherein the substance is outgas generated, when the wafer is irradiated with ion beam, from photo resist applied to the wafer.

12. The ion irradiation system of claim 11, wherein the outgas is hydrogen gas.

13. The ion irradiation system of claim 1, wherein the measuring instrument measures a change amount of a beam current.

14. The ion irradiation system of claim 1 further comprising a beam-breaking beam-current measuring instrument.

15. The ion irradiation system of claim 13, wherein a mechanism for finding a beam current value is available in the system, the mechanism uses a beam-current value of ion beam measured by the beam-breaking beam-current measuring instrument as a reference, and a zero point measured by the non-beam-breaking beam-current measuring instrument is set such that the reference becomes the zero point, and the beam current value is found by adding a change amount to the reference.

16. The ion irradiation system of claim 1, wherein the sensor has at least superconducting quantum interference device.

17. The ion irradiation system of claim 1, wherein the sensor is made from high-temperature superconductor.

18. The ion irradiation system of claim 1, wherein the beam-current measuring instrument including at least one sensor sensitive to magnetic flux has a detector for one of detecting and collecting magnetic field corresponding to a beam current.

19. The ion irradiation system of claim 1, wherein the beam-current measuring instrument including at least one sensor sensitive to magnetic flux has a magnetic shielding section for shielding the sensor against magnetism from outer space including a space where ion beam runs.

20. The ion irradiation system of claim 19, wherein the magnetic shielding section is made from superconductor.

21. The ion irradiation system of claim 19, wherein the magnetic shielding section is made from high-temperature superconductor.

22. The ion irradiation system of claim 19, wherein the magnetic shielding section has a gap.

23. The ion irradiation system of claim 1, wherein the measuring instrument is a dc current transformer.

24. The ion irradiation system of claim 1, wherein the measuring instrument is mount to the beam line of which cut face works as an insulator.

25. An ion implantation system comprising:
an ion irradiation system which includes:
a beam line including a leader and a trailer; and
a non-beam-breaking beam-current measuring instrument disposed between the leader and the trailer, and the non-beam-breaking beam-current measuring instrument includes at least one sensitive to magnetic flux.

26. A medium-current ion implantation system comprising:
an ion irradiation system which includes:
a beam line including a leader and a trailer; and
a non-beam-breaking beam-current measuring instrument disposed between the leader and the trailer, and the non-beam-breaking beam-current measuring instrument includes at least one sensor sensitive to magnetic flux.

27. A high-current ion implantation system comprising:
an ion irradiation system which includes:
a beam line including a leader and a trailer; and
a non-beam-breaking beam-current measuring instrument disposed between the leader and the trailer, and the non-beam-breaking beam-current measuring instrument includes at least one sensor sensitive to magnetic flux.

28. An electron-beam exposure system comprising:
an ion irradiation system which includes:
a beam line including a leader and a trailer; and
a non-beam-breaking beam-current measuring instrument disposed between the leader and the trailer, and the non-beam-breaking beam-current measuring instrument includes at least one sensor sensitive to magnetic flux.

29. An accelerator comprising:
an ion irradiation system which includes:
a beam line including a leader and a trailer; and
a non-beam-breaking beam-current measuring instrument disposed between the leader and the trailer, and the non-beam-breaking beam-current measuring instrument includes at least one sensor sensitive to magnetic flux.

30. A cyclotron comprising:
an ion irradiation system which includes:
a beam line including a leader and a trailer; and
a non-beam-breaking beam-current measuring instrument disposed between the leader and the trailer, and the non-beam-breaking beam-current measuring instrument includes at least one sensor sensitive to magnetic flux.

31. A linear accelerator comprising:
an ion irradiation system which includes:
a beam line including a leader and a trailer; and
a non-beam-breaking beam-current measuring instrument disposed between the leader and the trailer, and the non-beam-breaking beam-current measuring instrument includes at least one sensor sensitive to magnetic flux.

32. A synchrotron comprising:
an ion irradiation system which includes:
a beam line including a leader and a trailer; and
a non-beam-breaking beam-current measuring instrument disposed between the leader and the trailer, and the non-beam-breaking beam-current measuring instrument includes at least one sensor sensitive to magnetic flux.

33. Active components comprising:
a semiconductor, a liquid crystal, and a bio-chip, which are manufactured by an ion irradiation system which comprises:
a beam line including a leader and a trailer; and
a non-beam-breaking beam-current measuring instrument disposed between the leader and the trailer, and the non-beam-breaking beam-current measuring instrument includes at least one sensor sensitive to magnetic flux.

34. Passive components comprising:
a resistor, a coil, and a capacitor, which are manufactured by an ion irradiation system which comprises:
a beam line including a leader and a trailer; and
a non-beam-breaking beam-current measuring instrument disposed between the leader and the trailer, and the non-beam-breaking beam-current measuring instrument includes at least one sensor sensitive to magnetic flux.

* * * * *

UNITED STATES PATENT AND TRADEMARK OFFICE
CERTIFICATE OF CORRECTION

PATENT NO. : 6,822,247 B2
DATED : November 23, 2004
INVENTOR(S) : Sasaki

It is certified that error appears in the above-identified patent and that said Letters Patent is hereby corrected as shown below:

<u>Column 9,</u>
Line 49, after the word "one" insert -- sensor --

Signed and Sealed this

Twenty-fourth Day of May, 2005

JON W. DUDAS
*Director of the United States Patent and Trademark Office*